United States Patent
Shirasaki

(10) Patent No.: US 6,873,230 B2
(45) Date of Patent: Mar. 29, 2005

(54) HIGH-FREQUENCY WIRING BOARD

(75) Inventor: Takayuki Shirasaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 74 days.

(21) Appl. No.: 10/625,777

(22) Filed: Jul. 23, 2003

(65) Prior Publication Data
US 2004/0119565 A1 Jun. 24, 2004

(30) Foreign Application Priority Data
Jul. 25, 2002 (JP) ..................... P2002-216144

(51) Int. Cl.$^7$ ............. H01P 3/08; H05K 1/00; H05K 7/02
(52) U.S. Cl. ............. 333/246; 361/748; 361/760; 174/250
(58) Field of Search ............. 333/246, 254; 361/748, 760; 439/65; 257/664, 698; 174/250, 254, 255, 261, 262

(56) References Cited

U.S. PATENT DOCUMENTS 6,483,714 B1 * 11/2002 Kabumoto et al. ......... 361/760
6,700,789 B2 * 3/2004 Shirasaki ................ 361/748
6,726,488 B2 * 4/2004 Shirasaki ................ 439/65

FOREIGN PATENT DOCUMENTS

JP  2000-100993  4/2000

* cited by examiner

Primary Examiner—Patrick Wamsley
(74) Attorney, Agent, or Firm—Hogan & Hartson LLP

(57) ABSTRACT

The problem is that, since a coplanar ground conductor located immediately below a line conductor is absent near a through conductor for providing connection between the one ends of the line conductors each having the coplanar ground conductor, characteristic impedance mismatch occurs and this leads to poor transmission characteristics. The invention provides a high-frequency wiring board in which, given that the interval between the first/second line conductor and part of the first/second coplanar ground conductor located around each side of the line conductor is S, and that the distance between the first/second line conductor and its corresponding second/first coplanar ground conductor facing each other via the dielectric substrate is H, then the following relationship holds: S<H/2. Characteristic impedance matching is achieved in the joint between the first/second line conductor and the through conductor, and satisfactory transmission characteristics are accordingly attained in transmission of a millimeter-wave-band high-frequency signal.

10 Claims, 4 Drawing Sheets

HIGH-FREQUENCY WIRING BOARD

BACKGROUND OF THE INVENTION

1. Field of the Invention

The present invention relates to a high-frequency wiring board for achieving connection and mounting of a high-frequency integrated circuit such as an IC and LSI or a high-frequency circuit device used in a millimeter-wave high-frequency band, and more particularly to a high-frequency wiring board having a signal-transmission through conductor that allows improvement in high-frequency signal transmission characteristics.

2. Description of the Related Art

FIGS. 6 and 7 are a plan view and a sectional view, respectively, showing one example of a conventional high-frequency wiring board for transmitting a millimeter-wave-band high-frequency signal.

In FIGS. 6 and 7, reference numeral 21 denotes a high-frequency wiring board and reference numeral 22 denotes a dielectric substrate. The dielectric substrate 22 has a first line conductor 23 and a second line conductor 24 respectively formed on the top and bottom surfaces thereof. The first and second line conductors 23 and 24 are electrically connected to each other, at their one ends, by a through conductor 25. The dielectric substrate 22 also has a first coplanar ground conductor 26 and a second coplanar ground conductor 27 respectively formed on the top and bottom surfaces thereof. The first and second coplanar ground conductors 26 and 27 are electrically connected to each other by a plurality of grounding through conductors 28.

The high-frequency wiring board 21 has the following drawback. Due to a stray capacitance present in the joint between the first and second line conductors 23, 24 and the through conductor 25, there occurs characteristic impedance mismatch, resulting in an increase in reflection loss of high-frequency signals. This causes degradation of the transmission characteristics.

To overcome such a problem, for example, a technique for achieving characteristic impedance matching in the joint between the line conductor and the through conductor has been proposed to date (refer to Japanese Unexamined Patent Publication JP-A 2000-100993 (2000)). According to this technique, by increasing the interval between the line conductor and the nearby coplanar ground conductor partly in the vicinity of the joint between the line conductor and the through conductor, the stray capacitance can be reduced, whereby making it possible to achieve characteristic impedance matching in the joint between the line conductor and the through conductor. As a result, the high-frequency signal transmission characteristics can be enhanced.

However, the conventional high-frequency wiring board described just above also has the following drawback. In the case of increasing the interval between the line conductor and the nearby coplanar ground conductor in the vicinity of the joint between the line conductor and the through conductor, the coplanar ground conductor located immediately below each of the line conductors is absent in the vicinity of the through conductor. In the millimeter-wave frequency band, the high-frequency signal has a short wavelength, and thus characteristic impedance mismatch occurs in the vicinity of the joint between the line conductor and the through conductor. As a result, the higher the frequency, the poorer the transmission characteristics can be.

SUMMARY OF THE INVENTION

The invention has been devised in view of the above-described problems with the conventional art, and accordingly its object is to provide a high-frequency wiring board that succeeded in providing satisfactory high-frequency signal transmission characteristics even in a millimeter-wave high-frequency band by achieving characteristic impedance matching in a joint between line and through conductors.

The invention provides a high-frequency wiring board comprising:

a dielectric substrate;

a first line conductor formed on one principal surface of the dielectric substrate;

a second line conductor formed on another principal surface of the dielectric substrate, with its one end arranged face to face with one end of the first line conductor;

a through conductor piercing through the dielectric substrate, for providing electrical connection between the one ends of the first and second line conductors;

a first coplanar ground conductor formed around the one end of the first line conductor of the one principal surface at a predetermined interval; and a second coplanar ground conductor formed around the one end of the second line conductor of the other principal surface at a predetermined interval, wherein the following relationship holds:

$$S<H/2$$

in which S represents an interval between the first line conductor and part of the first coplanar ground conductor located around each side of the first line conductor, as well as an interval between the second line conductor and part of the second coplanar ground conductor located around each side of the second line conductor and H represents a distance between the first line conductor and the second coplanar ground conductor facing each other via the dielectric substrate, as well as a distance between the second line conductor and the first coplanar ground conductor facing each other via the dielectric substrate.

The invention further provides a high-frequency wiring board comprising:

a dielectric substrate composed of a plurality of dielectric layers stacked on top of each other;

a first line conductor formed on one principal surface of the dielectric layer;

a second line conductor formed on another principal surface, which is located differently from the one principal surface, of the dielectric layer, with its one end arranged face to face with one end of the first line conductor;

a through conductor piercing through the dielectric layers, for providing electrical connection between the one ends of the first and second line conductors;

a first coplanar ground conductor formed around the one end of the first line conductor of the one principal surface at a predetermined interval;

a second coplanar ground conductor formed around the one end of the second line conductor of the other principal surface at a predetermined interval;

a first inter-layer ground conductor which is formed between the dielectric layers interposed between the first line conductor and the other principal surface; and a second inter-layer ground conductor which is formed between the dielectric layers interposed between the second line conductor and the one principal surface, wherein the following relationship holds:

$$S<H/2$$

in which S represents an interval between the first line conductor and part of the first coplanar ground conductor located around each side of the first line conductor, as well as an interval between the second line conductor and part of the second coplanar ground conductor located around each side of the second line conductor and H represents a distance between the first line conductor and the first inter-layer ground conductor facing each other via the dielectric layer, as well as a distance between the second line conductor and the second inter-layer ground conductor facing each other via the dielectric layer.

According to the invention, as described above, the interval S between the first line conductor and part of the first coplanar ground conductor located around each side of the first line conductor, as well as the interval S between the second line conductor and part of the second coplanar ground conductor located around each side of the second line conductor, is adjusted to be sufficiently short relative to the distance H between the first line conductor and the second coplanar ground conductor facing each other via the dielectric substrate, as well as the distance H between the second line conductor and the first coplanar ground conductor facing each other via the dielectric substrate, so that the following relationship holds: S<H/2. Otherwise, the interval S between the first line conductor and part of the first coplanar ground conductor located around each side of the first line conductor, as well as the interval S between the second line conductor and part of the second coplanar ground conductor located around each side of the second line conductor, is adjusted to be sufficiently short relative to the distance H between the first line conductor and the first inter-layer ground conductor facing each other via the dielectric layer, as well as the distance H between the second line conductor and the second inter-layer ground conductor facing each other via the dielectric layer, so that the following relationship holds: S<H/2. Hence, the propagation mode of the electromagnetic wave propagating through the line conductors is dependent principally on the region between the line conductor and the coplanar ground conductor. Thus, even though the coplanar ground conductor (or the inter-layer ground conductor), located immediately below the line conductor so as to face the line conductor, is absent in the vicinity of the joint between the line conductor and the through conductor, it is possible to suppress occurrence of characteristic impedance mismatch. As a result, satisfactory transmission characteristics can be achieved in transmission of a millimeter-wave-band high-frequency signal.

According to the invention, there is provided a high-frequency wiring board having line conductors connected to each other through a signal-transmission through conductor, which is capable of transmitting a millimeter-wave high-frequency signal, with satisfactory signal transmission characteristics, by achieving characteristic impedance matching in the joint between the line and through conductors.

In the invention, it is preferable that the interval between the one end of the first line conductor and the first coplanar ground conductor, as well as the interval between the one end of the second line conductor and the second coplanar ground conductor, is made longer than the interval S, and equal to or shorter than three times the interval S.

In the invention, it is preferable that a high-frequency signal to be transmitted through the first and second line conductors falls in a range from 55 to 80 GHz.

According to the invention, the interval between the one end of the first line conductor and the first coplanar ground conductor, as well as the interval between the one end of the second line conductor and the second coplanar ground conductor, is made longer than the interval S, and equal to or shorter than three times the interval S. This makes it possible to achieve satisfactory impedance matching for microwave and millimeter wave-band high-frequency signals (for example, 55 to 80 GHz) in the joint between the line conductor and the through conductor. As a result, it is possible to minimize degradation of the transmission characteristics attributed to the interposition of the through conductor.

In the invention, it is preferable that the interval between the one end of the first line conductor and the first coplanar ground conductor, as well as the interval between the one end of the second line conductor and the second coplanar ground conductor, is made shorter than the interval S.

In the invention, it is preferable that a high-frequency signal to be transmitted through the first and second line conductors falls in a range from 80 to 110 GHz.

According to the invention, the interval between the one end of the first line conductor and the first coplanar ground conductor, as well as the interval between the one end of the second line conductor and the second coplanar ground conductor, is made shorter than the interval S. By exploiting the shorter interval, it is possible to confine the electromagnetic field as observed in the joint acting as an electromagnetic-field mode conversion portion. This helps suppress unnecessary radiation of an electromagnetic wave from the region between one end of the first/second line conductor and the first/second coplanar ground conductor. As a result, for example, a millimeter-wave-band high-frequency signal of 80 to 110 GHz can be transmitted satisfactorily.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
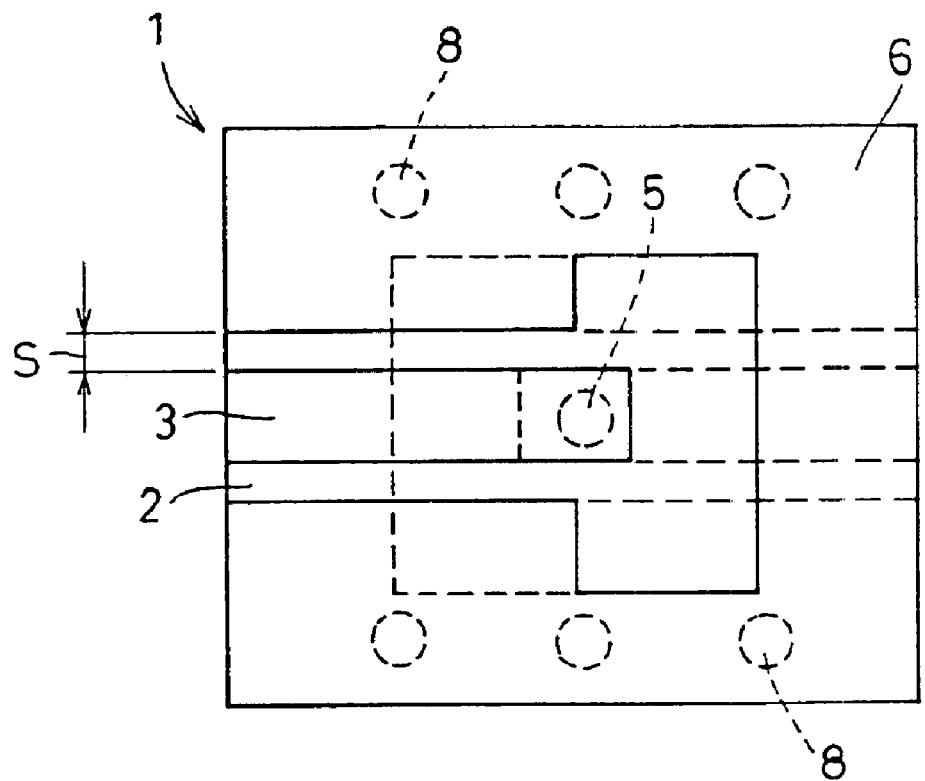
FIG. 1 is a plan view showing one example of a first embodiment of a high-frequency wiring board according to the invention.

Now referring to the drawings, preferred embodiments of the invention are described below.

Figure 2:
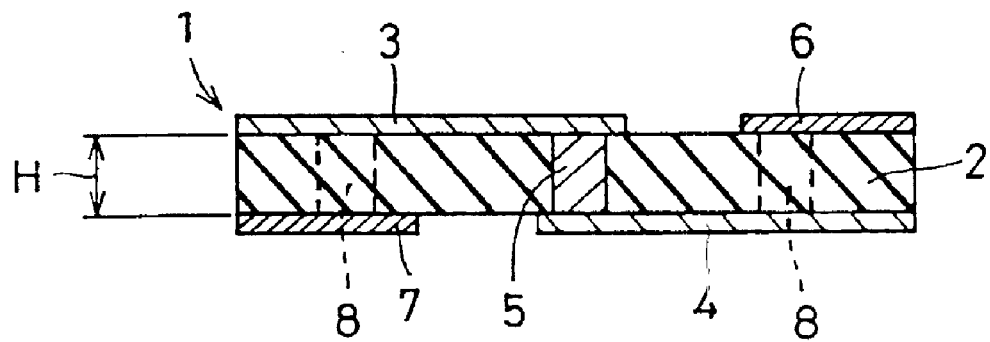
FIG. 2 is a sectional view showing one example of the first embodiment of the high-frequency wiring board according to the invention.

FIG. 1 is a plan view showing one example of a first embodiment of a high-frequency wiring board according to the invention and FIG. 2 is a sectional view showing one example of the first embodiment of the high-frequency wiring board according to the invention. In these figures, reference numeral 1 denotes the high-frequency wiring board and reference numeral 2 denotes a dielectric substrate. The dielectric substrate 2 has a first line conductor 3 and a second line conductor 4 respectively formed on the top surface (i.e. one principal surface) and the bottom surface (i.e. the other principal surface) thereof, with their one ends arranged face to face with each other. The first and second line conductors 3 and 4 are electrically connected to each other, at their one ends, by a through conductor 5. The dielectric substrate 2 also has a first coplanar ground conductor 6 and a second coplanar ground conductor 7 respectively formed on the top and bottom surfaces thereof. The first and second coplanar ground conductors 6, 7 are so disposed as to extend around one ends of the first and second line conductor 3, 4, with an interval which is equal to or shorter than ¼ of an effective wavelength of a high-frequency signal secured with respect to each side of the line conductor 3, 4, respectively. Moreover, the first and second coplanar ground conductors 6 and 7 are electrically connected to each other by a plurality of grounding through conductors 8 piercing through the dielectric substrate 2. The grounding through conductors 8 are spaced at an interval equal to or shorter than ¼ of the effective wavelength of the high-frequency signal.

Moreover, the high-frequency wiring board 1 comprises the dielectric substrate 2, the first line conductor 3, the second line conductor 4, the through conductor 5, the first coplanar ground conductor 6, the second coplanar ground conductor 7 and a plurality of grounding through conductors 8. The dielectric substrate 2 has the first line conductor 3 and the second line conductor 4 respectively formed on the top surface (i.e. one principal surface) and the bottom surface (i.e. the other principal surface) thereof, with their one ends arranged face to face with each other. The through conductor 5 is electrically connected to one ends of the first and second line conductors 3 and 4 piercing through the dielectric substrate 2.

The first coplanar ground conductor 6 is formed around one end of the first line conductor 3, at a predetermined interval, namely, the interval between each side of the line conductor 3 is equal to or shorter than ¼ of an effective wavelength of a high-frequency signal. The second coplanar ground conductor 7 is formed around one end of the second line conductor 4, at a predetermined interval, namely, the interval between each side of the line conductor 4 is equal to or shorter than ¼ of an effective wavelength of a high-frequency signal. A plurality of grounding through conductors 8 are spaced at an interval equal to or shorter than ¼ of the effective wavelength of the high-frequency signal between the first and second coplanar ground conductors 6 and 7 piercing through the dielectric substrate 2.

In the first embodiment of the high-frequency wiring board 1 of the invention, as shown in FIGS. 1 and 2, given that the interval between part of the first line conductor 3 which possesses a predetermined characteristic impedance and part of the first coplanar ground conductor 6 located around each side of the line conductor, as well as the interval between part of the second line conductor 4 which possesses a predetermined characteristic impedance and part of the second coplanar ground conductor 7 located around each side of the line conductor is S, and that the distance between the first line conductor 3 and the second coplanar ground conductor 7 facing each other via the dielectric substrate 2, as well as the distance between the second line conductor 4 and the first coplanar ground conductor 6 facing each other via the dielectric substrate 2, is H, then the following relationship holds: S<H/2.

Note that, although FIG. 1 shows only the top surface of the dielectric substrate 2, namely, one principal surface on which the first line conductor 3 is disposed, on the bottom surface of the dielectric substrate 2, namely, the other principal surface on which the second line conductor 4 is disposed, the arrangement of the second line conductor 4 and the second coplanar ground conductor 7 is basically the same as that of the first line conductor 3 and the first coplanar ground conductor 6 on the one principal surface.

In this structure, the interval S between the first line conductor 3 and the first coplanar ground conductor 6, as well as the interval S between the second line conductor 4 and the second coplanar ground conductor 7 is adjusted to be shorter than ½ of the distance H between the first line conductor 3 and its corresponding second coplanar ground conductor 7 facing each other via the dielectric substrate 2, as well as the distance H between the second line conductor 4 and its corresponding first coplanar ground conductor 6 facing each other via the dielectric substrate 2 (In the high-frequency wiring board 1, the thickness of the dielectric substrate 2 and the length of the through conductor 5 are each equal to H). By so doing, the electro magnetic field distribution of the high-frequency signal propagating through the first and second line conductors 3 and 4 is concentrated at the region between the first line conductor 3 and the first coplanar ground conductor 6 and the region between the second line conductor 4 and the second coplanar ground conductor 7, and therefore the propagation mode of the electromagnetic wave of the high-frequency signal propagating through the first and second line conductors 3 and 4 is dependent principally on the region between the first line conductor 3 and the first coplanar ground conductor 6 and the region between the second line conductor 4 and the second coplanar ground conductor 7. Thus, in the vicinity of the through conductor 5, even though the second coplanar ground conductor 7, located immediately below the first line conductor 3, and the first coplanar ground conductor 6, located immediately below the second line conductor 4, are each absent in front of that end of the line conductor which is connected to the through conductor 5, it is possible to suppress occurrence of characteristic impedance mismatch in the vicinity of the through conductor 5. As a result, satisfactory transmission characteristics can be achieved in transmission of a millimeter-wave-band high-frequency signal.

Figure 3:
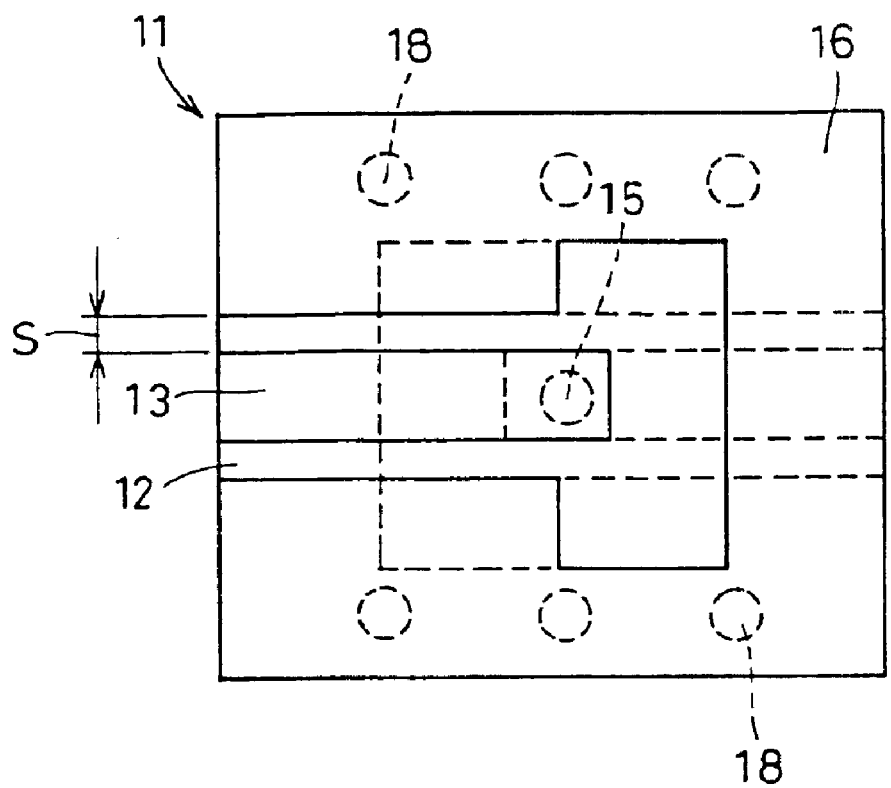
FIG. 3 is a plan view showing one example of a second embodiment of a high-frequency wiring board according to the invention.
Figure 4:
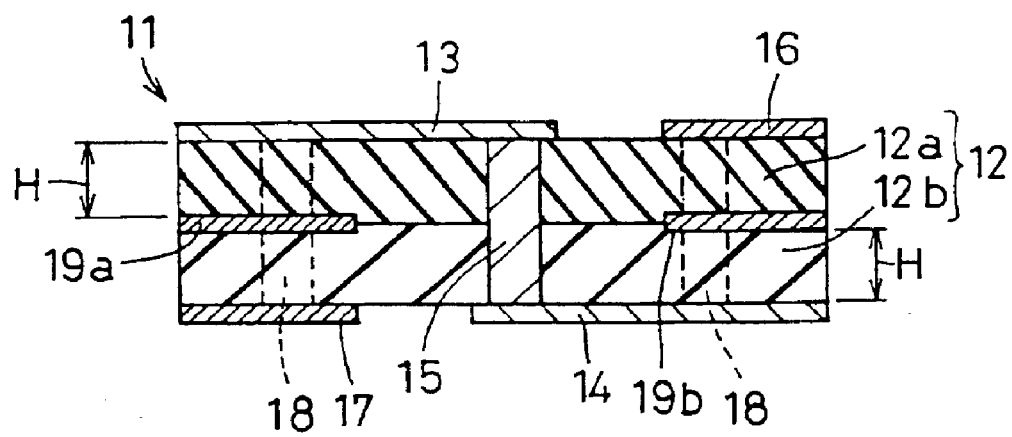
FIG. 4 is a sectional view showing one example of the second embodiment of the high-frequency wiring board according to the invention.

Next, FIG. 3 is a plan view showing one example of a second embodiment of a high-frequency wiring board according to the invention and FIG. 4 is a sectional view showing one example of the second embodiment of the high-frequency wiring board according to the invention. In FIGS. 3 and 4, reference numeral 11 denotes a high-frequency wiring board and reference numeral 12 denotes a dielectric substrate composed of a plurality of dielectric layers 12a and 12b stacked on top of each other. Reference numeral 13 denotes a first line conductor formed on one principal surface, i.e., the top surface, in this example, of the dielectric layer 12a. Reference numeral 14 denotes a second line conductor formed on the other principal surface, which is located differently from the one principal surface of the dielectric layer 12a, of the dielectric layer 12b. The first and second line conductors 13 and 14 are disposed with their one ends arranged face to face with each other. Reference numeral 15 denotes a through conductor piercing through the dielectric layers 12a and 12b, for providing electrical connection between the one ends of the first and second line conductors 13 and 14. Reference numerals 16 and 17 denote a first coplanar ground conductor and a second coplanar ground conductor, respectively. The first and second coplanar ground conductors 16, 17 are so disposed as to extend around one end of the first and second line conductor 13, 14, with an interval which is equal to or shorter than ¼ of the effective wavelength of the high-frequency signal secured with respect to each side of the line conductor 13, 14, respectively. Reference numeral 18 denotes a plurality of grounding through conductors piercing through the dielectric layers 12a and 12b, for providing electrical connection between the first and second coplanar ground conductors 16 and 17. Reference numeral 19a denotes a first inter-layer ground conductor which is formed between the dielectric layers 12a and 12b interposed between the first line conductor 13 and the other principal surface of the dielectric layer 12b. Reference numeral 19b denotes a second inter-layer ground conductor which is formed between the dielectric layers 12a and 12b interposed between the second line conductor 14 and the one principal surface of the dielectric layer 12a.

Moreover, the high-frequency wiring board 11 comprises the dielectric substrate 12, the first line conductor 13, the second line conductor 14, the through conductor 15, the first coplanar ground conductor 16, the second coplanar ground conductor 17, a plurality of grounding through conductors 18, the first inter-layer ground conductor 19a and the second inter-layer ground conductor 19b. The dielectric substrate 12 is formed, stacking the first dielectric layer 12a and the second dielectric layer 12b. The first dielectric layer 12a has the first line conductor 13 formed on the top surface (i.e. one principal surface). The second dielectric layer 12b has the second line conductor 14 formed on the other principal surface, which is located differently from the dielectric layer 12a, with one ends of the first line conductor 13 arranged face to face with each other.

The through conductor 15 is electrically connected to one ends of the first and second line conductors 13 and 14 piercing through the first and second dielectric layers 12a and 12b. The first coplanar ground conductor 16 is formed around one end of the first line conductor 13 located on the top surface of the first dielectric layer 12a, at a predetermined interval, namely, the interval between each side of the first line conductor 13 is equal to or shorter than ¼ of an effective wavelength of a high-frequency signal. The second coplanar ground conductor 17 is formed around one end of the second line conductor 14 located on the bottom surface of the second dielectric layer 12b, at a predetermined interval, namely, the interval between each side of the second line conductor 14 is equal to or shorter than ¼ of an effective wavelength of a high-frequency signal.

A plurality of grounding through conductors 18 are electrically connected to the first and second coplanar ground conductors 16 and 17, piercing through the first and second dielectric layers 12a and 12b. The first inter-layer ground conductor 19a is formed between the dielectric layers 12a and 12b interposed between the first line conductor 13 and the bottom surface of the second dielectric layer 12b. The second inter-layer ground conductor 19b is formed between the dielectric layers 12a and 12b interposed between the second line conductor 14 and the top surface of the dielectric layer 12a.

In the second embodiment of the high-frequency wiring board 11 of the invention, as shown in FIGS. 3 and 4, given that the interval between the first line conductor 13 and part of the first coplanar ground conductor 16 located around each side of the line conductor, as well as the interval between the second line conductor 14 and part of the second coplanar ground conductor 17 located around each side of the line conductor, is S, and that the distance between the first line conductor 13 and the first inter-layer ground conductor 19a facing each other via the dielectric layer 12a, as well as the distance between the second line conductor 14 and the second inter-layer ground conductor 19b facing each other via the dielectric layer 12b, is H, then the following relationship holds: S<H/2.

In this structure, the interval S between the first line conductor 13 and the first coplanar ground conductor 16, as well as the interval S between the second line conductor 14 and the second coplanar ground conductor 17 is adjusted to be shorter than the distance H between the first line conductor 13 and the first inter-layer ground conductor 19a, as well as the distance H between the second line conductor 14 and the second inter-layer ground conductor 19b. By so doing, the electromagnetic field distribution of the high-frequency signal propagating through the first and second line conductors 13 and 14 is concentrated at the region between the first line conductor 13 and the first coplanar ground conductor 16 and the region between the second line conductor 14 and the second coplanar ground conductor 17, and therefore the propagation mode of the electromagnetic wave of the high-frequency signal propagating through the first and second line conductors 13 and 14 is dependent principally on the region between the first line conductor 13 and the first coplanar ground conductor 16 and the region between the second line conductor 14 and the second coplanar ground conductor 17. Thus, in the vicinity of the through conductor 15, even though the first inter-layer ground conductor 19a, located immediately below the first line conductor 13, and the second inter-layer ground conductor 19b, located immediately below the second line conductor 14, are each absent in front of that end of the line conductor which is connected to the through conductor 15, it is possible to suppress occurrence of characteristic impedance mismatch in the vicinity of the through conductor 15. As a result, satisfactory transmission characteristics can be achieved in transmission of a millimeter-wave-band high-frequency signal.

As described hereinabove, the arrangements and configurations of the first line conductor 3, 13; the second line conductor 4, 14; the through conductor 5, 15; the dielectric substrate 2, 12 (the dielectric layer 12a, 12b); the first and second coplanar ground conductors 6, 16 and 7, 17; the grounding through conductor 8, 18; and the inter-layer ground conductor 19a, 19b can be determined arbitrarily.

Note that, in the example shown in FIGS. 1 and 3, the interval from part of the first/second coplanar ground conductor 6, 16, 7, 17 to one ends of the first and second line conductors 3, 13 and 4, 14 electrically connected to each other by the through conductor 5, 15 is made longer than the interval S between the first/second line conductor 3, 13, 4, 14 and part of the first/second coplanar ground conductor 6, 16, 7, 17 located around each side of the line conductor. By so doing, the stray capacitance present in the joint between the line conductor 3, 13, 4, 14 and the through conductor 5, 15 can be reduced, whereby making it possible to achieve characteristic impedance matching.

As described just above, in the case of increasing the interval from part of the first/second coplanar ground conductor 6, 16, 7, 17 to one end of the first/second line conductor 3, 13, 4, 14, it is preferable that the interval is made longer than the interval S on each side of the through conductor 5, 15. It is also preferable that the interval is further increased in the region opposite to one end of the first/second line conductor 3, 13, 4, 14. Then, by adjusting each of the intervals to be equal to or shorter than three times the interval S, satisfactory impedance matching can be achieved for microwave and millimeter wave-band high-frequency signals (for example, 55 to 80 GHz) in the joint between the line conductor and the through conductor 5, 15. As a result, it is possible to minimize degradation of the transmission characteristics attributed to the interposition of the through conductor 5, 15.

In the alternative, the interval from part of the first/second coplanar ground conductor 6, 16, 7, 17 to one ends of the first and second line conductors 3, 13 and 4, 14 electrically connected to each other by the through conductor 5, 15 can be made approximately equal to or shorter than the interval S between the first/second line conductor 3, 13, 4, 14 and part of the first/second coplanar ground conductor 6, 16, 7, 17 located around each side of the line conductor. By decreasing the interval, it is possible to suppress unnecessary radiation of an electromagnetic wave from the region between the line conductor 3, 13, 4, 14 and the coplanar ground conductor 6, 16, 7, 17.

In the case of decreasing the interval from part of the first/second coplanar ground conductor 6, 16, 7, 17 to one end of the first/second line conductor 3, 13, 4, 14, the interval should preferably be made shorter than the interval S near the joint between the line conductor and the through conductor 5, 15. By exploiting the shorter interval, it is possible to confine the electromagnetic field as observed in the joint acting as an electromagnetic-field mode conversion portion. This helps suppress unnecessary radiation of an electromagnetic wave from the region between one end of the first/second line conductor 3, 13, 4, 14 and the first/second coplanar ground conductor 6, 16, 7, 17. As a result, for example, a millimeter-wave-band high-frequency signal of 80 to 110 GHz can be transmitted satisfactorily. In addition, at this time, the width of that part of the first/second line conductor 3, 13, 4, 14 which is close to the joint, i.e., the portion connected to the through conductor 5, 15, should preferably be made narrower than the width of that part of the first/second coplanar ground conductor 6, 16, 7, 17 which is arranged around each side of the line conductor at the interval S. By so doing, the stray capacitance present in the joint can be successfully reduced.

The examples of materials used for the dielectric substrate 2, 12 (the dielectric layer 12a, 12b) constituting the high-frequency wiring board 1, 11 of the invention include: inorganic materials, for example ceramics materials such as alumina ($Al_2O_3$) ceramics and mullite ($3Al_2O_3 \cdot 2SiO_2$) ceramics, or glass ceramics; and resin materials, for example fluorine resin such as tetrafluoroethylene resin (polytetrafluoroethylene: PTFE), tetrafluoroethylene-ethylene copolymer resin (ETFE), and tetrafluoroethylene-perfluoroalkoxyethylene copolymer resin (tetrafluoroethylene-perfluoroalkylvinylether copolymer resin: PFA), or glass epoxy resin, polyphenyleneether resin, liquid crystal polyester, polyimide. Moreover, the shape and dimension (thickness, width, and length) of the high-frequency wiring board 1, 11 are determined in accordance with the frequency and characteristic impedance of the high-frequency signal in use.

The first and second line conductors 3, 13 and 4, 14 constituting the high-frequency wiring board 1, 11 of the invention are each formed from a conductor layer made of a metal material which lends itself to high-frequency signal transmission. The examples thereof include: a Cu layer; a Mo—Mn layer; a W layer; a Mo—Mn metallized layer having an Ni plating layer and an Au plating layer clothed thereon; a W metallized layer having an Ni plating layer and an Au plating layer clothed thereon; a Cr—Cu alloy layer; a Cr—Cu alloy layer having an Ni plating layer and an Au plating layer clothed thereon; a $Ta_2N$ layer having an Ni—Cr alloy layer and an Au plating layer clothed thereon; a Ti layer having a Pt layer and an Au plating layer clothed thereon; and an Ni—Cr alloy layer having a Pt layer and an Au plating layer clothed thereon. Using such a conductor layer, the line conductor is formed by means of the thick-film printing method, the thin-film forming method of various types, or the plating method. The thickness and width of the line conductor is also determined in accordance with the frequency and characteristic impedance of the high-frequency signal to be transmitted.

Moreover, the first and second coplanar ground conductors 6, 16, and 7, 17 and the first and second inter-layer ground conductors 19a and 19b are each formed using the same material and method as those used for the first and second line conductors 3, 13 and 4, 14. The interval between the first/second line conductor 3, 13, 4, 14 and its corresponding first/second coplanar ground conductor 6, 16, 7, 17 is determined in accordance with the frequency and characteristic impedance of the high-frequency signal to be transmitted. The through conductor 5, 15 is so formed as to provide electrical connection between the one ends of the first and second line conductors 3, 13 and 4, 14. For example, the through conductor 5, 15 is realized by forming a through hole conductor or a via hole conductor, or by burying a metal plate, a metal rod, or a metal pipe. The grounding through conductor 8, 18 is so formed as to provide connection between the first and second coplanar ground conductors 6, 16 and 7, 17, and to provide connection between the first/second coplanar ground conductor 6, 16, 7, 17 and the first/second inter-layer ground conductor 19a, 19b. For example, the grounding through conductor 8, 18 is realized by forming a through hole conductor or a via hole conductor, or by burying a metal plate, a metal rod, or a metal pipe.

The high-frequency wiring board 1, 11 is fabricated as follows. In the case of forming the dielectric substrate 2, 12 from glass ceramics, firstly, there is prepared a glass ceramic green sheet to form the dielectric substrate 2, 12 (the dielectric layer 12a, 12b). Subsequently, using the conventionally-known punching method and screen printing method, onto the ceramic green sheet is applied a Cu or Ag conductor paste in the predetermined conductor patterns, thereby obtaining the first and second line conductors 3, 13 and 4, 14; the through conductor 5, 15; the first and second coplanar ground conductors 6, 16, and 7, 17; the first and second inter-layer ground conductors 19a and 19b; and the grounding through conductor 8, 18. Next, the sheet body is fired at a temperature of 1000° C. Lastly, the conductor layers are each plated with Ni and Au.

Working Examples

Working examples of the high-frequency wiring board according to the invention will be described below.

Working Example of the High-frequency Wiring Board According to the First Embodiment of the Invention The high-frequency wiring board 1 according to the first embodiment of the invention is fabricated as follows. There is prepared a 0.2 mm-thick dielectric substrate 2 made of glass ceramics having a relative dielectric constant of 6. On the top and bottom surfaces of the dielectric substrate 2 are formed a first line conductor 3 and a second line conductor 4, respectively, that are each made of a Cu metallized layer having an Ni plating layer and an Au plating layer clothed thereon. The first and second line conductors 3 and 4 are disposed with their one ends arranged face to face with each other. Moreover, on the top and bottom surfaces of the dielectric substrate 2 are formed a first coplanar ground conductor 6 and a second coplanar ground conductor 7, respectively, that are each made of a Cu metallized layer. The first/second coplanar ground conductor 6, 7 is formed around one end of the first/second line conductor 3, 4 so as to cover substantially the entire surface of the dielectric substrate 2. Note that a line width W of the first/second line conductor 3, 4; an interval S between the first/second line conductor 3, 4 and part of the first/second coplanar ground conductor 6, 7 located around each side of the line conductor; and a distance H between the first/second line conductor 3, 4 and its corresponding second/first coplanar ground conductor 7, 6 facing each other via the dielectric substrate 2 (equivalent to the thickness of the dielectric substrate 2 and the length of the through conductor 5) are each so determined as to take several different values as listed in Table 1. A through conductor 5 for providing connection between the one ends of the first and second line conductors 3 and 4 is made of a Cu metallized element having a substantially circular cross-sectional profile which is 0.1 mm in diameter. Thereby, Test samples 1 to 3 of the high-frequency wiring board 1 embodying the invention are obtained.

Figure 6:
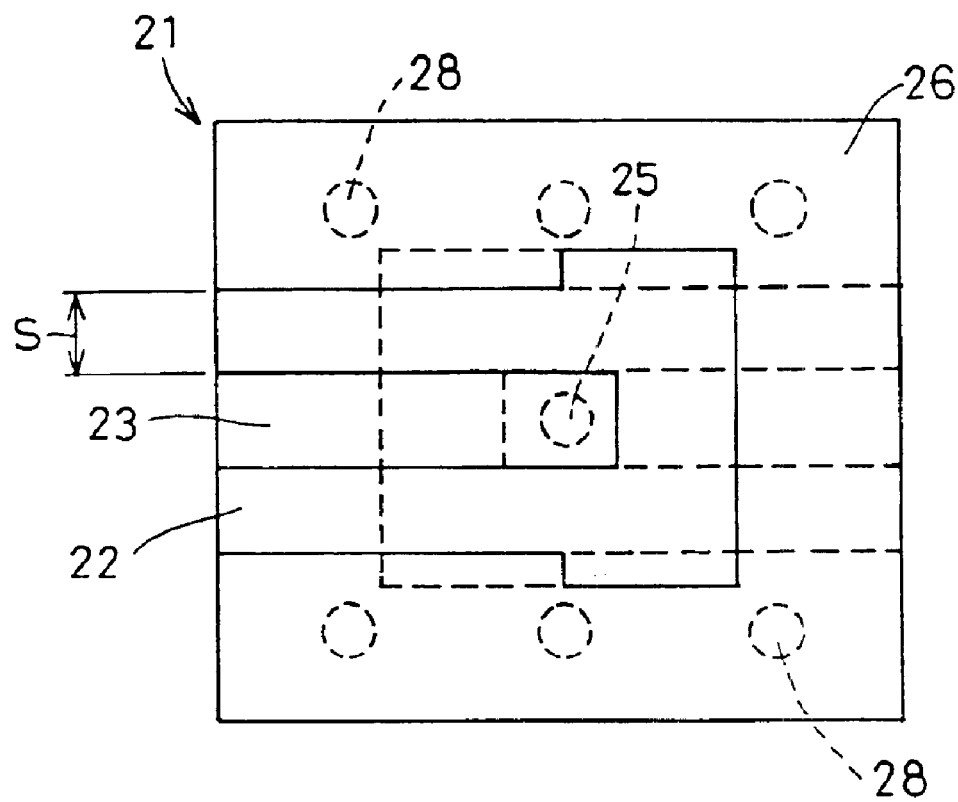
FIG. 6 is a plan view showing an example of a conventional high-frequency wiring board.
Figure 7:
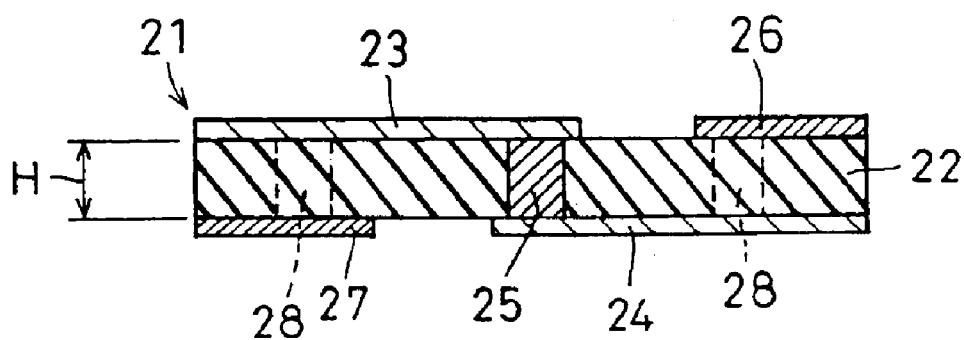
FIG. 7 is a sectional view showing the conventional high-frequency wiring board.

On the other hand, Comparative example is fabricated basically in the same manner as in Test samples 1 to 3, whose structure is shown in FIGS. 6 and 7. Comparative example includes: a dielectric substrate 22; a first line conductor 23; a second line conductor 24; a through conductor 25; a first coplanar ground conductor 26; a second coplanar ground conductor 27; and a grounding through conductor 28. Note that a line width W of the first/second line conductor 23, 24; an interval S between the first/second line conductor 23, 24 and part of the first/second coplanar ground conductor 26, 27 located around each side of the line conductor; and a distance H between the first/second line conductor 23, 24 and its corresponding second/first coplanar ground conductor 27, 26 facing each other via the dielectric substrate 22 (equivalent to the thickness of the dielectric substrate 22 and the length of the through conductor 25) are each so determined as to take several different values as listed in Table 1. Thereby, Test samples 4 and 5 of the high-frequency wiring board 21 of Comparative example are obtained.

TABLE 1

|  | W | S | H |
|---|---|---|---|
| Sample 1 | 0.1 mm | 0.05 mm | 0.2 mm |
| Sample 2 | 0.15 mm | 0.075 mm | 0.2 mm |
| Sample 3 | 0.18 mm | 0.1 mm | 0.2 mm |
| Sample 4 | 0.22 mm | 0.15 mm | 0.2 mm |
| Sample 5 | 0.24 mm | 0.2 mm | 0.2 mm |

Then, Test samples 1 to 5 of Implementation and Comparative examples of the invention are each connected to a network analyzer by means of a wafer probe to measure reflection loss of high-frequency signals. The measured data is shown in FIG. 5.

Figure 5:
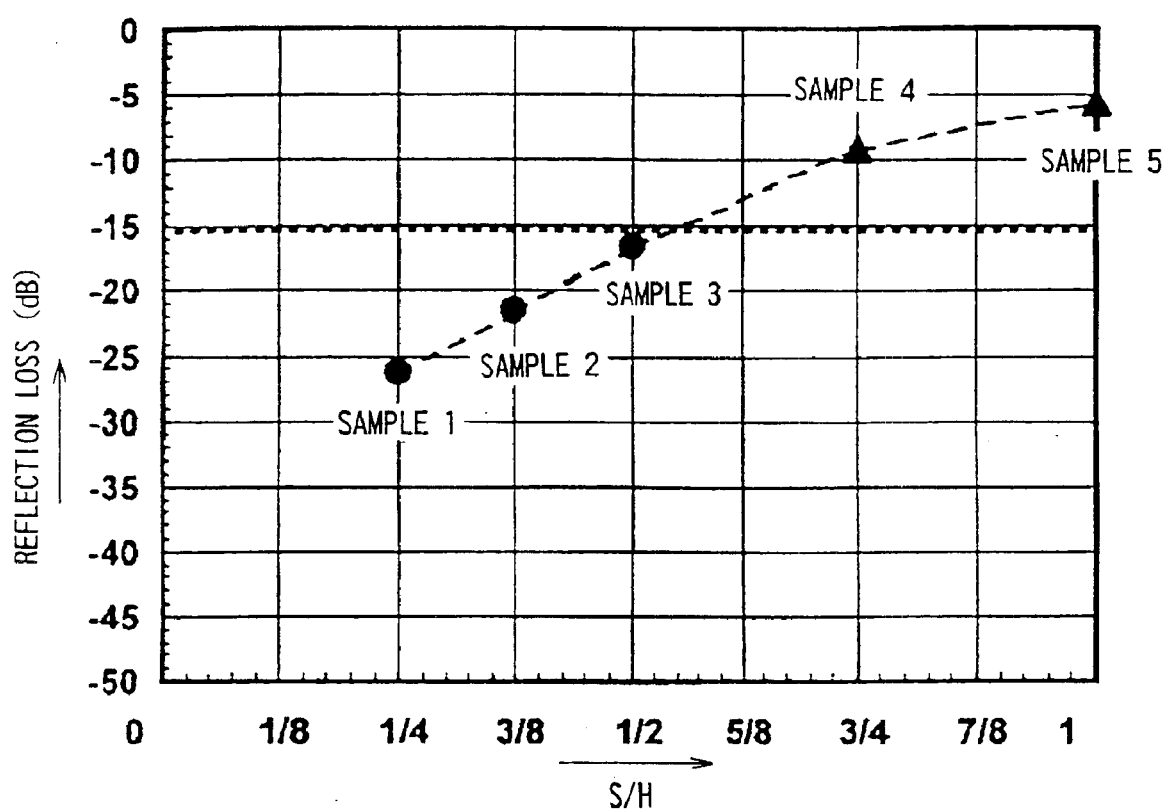
FIG. 5 is a graph showing reflection loss of high-frequency signals as observed in Practical and Comparative examples of the high-frequency wiring board according to the invention.

FIG. 5 is a graph showing the maximum reflection loss measured in each of Test samples 1 to 5, as observed in the frequency range of up to 50 GHz. In the graph, the ratio S/H between the interval S and the distance H is taken along the horizontal axis, and the reflection loss is taken along the vertical axis (unit: dB).

As seen from the results shown in FIG. 5, in any of Test samples 1 to 3 fabricated as Implementation examples of the invention, a coefficient value on reflection loss: −15 dB required for proper high-frequency signal transmission is satisfied. By contrast, in any of Test samples 4 and 5 fabricated as Comparative examples, the larger the ratio S/H, the greater the reflection loss. Resultantly, the reflection-loss value exceeds −10 dB.

Hence, according to the first embodiment of the high-frequency wiring board 1 of the invention, given that the interval between the first line conductor 3 and part of the first coplanar ground conductor 6 located around each side of the line conductor, as well as the interval between the second line conductor 4 and part of the second coplanar ground conductor 7 located around each side of the line conductor, is S, and that the distance between the first line conductor 3 and its corresponding second coplanar ground conductor 7 facing each other via the dielectric substrate 2, as well as the distance between the second line conductor 4 and its corresponding first coplanar ground conductor 6 facing each other via the dielectric substrate 2, is H, then the following relationship holds: S<H/2. As a result, it has been confirmed that occurrence of characteristic impedance mismatch can be suppressed in the joint between the first and second line conductors 3, 4 and the through conductor 5, and thus satisfactory transmission characteristics can be achieved in transmission of a millimeter-wave-band high-frequency signal.

Working Example of the High-frequency Wiring Board According to the Second Embodiment of the Invention The high-frequency wiring board 11 according to the second embodiment of the invention is fabricated in the same manner as in the first embodiment of the high-frequency wiring board 1 of the invention. The high-frequency wiring board 11 includes: a dielectric substrate 12; a first line conductor 13; a second line conductor 14; a through conductor 15; a first coplanar ground conductor 16; a second coplanar ground conductor 17; and a grounding through conductor 18. Note that, in this example, the dielectric substrate 12 is composed of two layers: 0.2 mm-thick dielectric layers 12a and 12b. Moreover, inter-layer ground conductors 19a and 19b are formed between the dielectric layers 12a and 12b so as to face the first and second line conductors 13 and 14, respectively.

Thereby, Test samples 1 to 3 of the second embodiment of the high-frequency wiring board 11 of the invention are obtained.

Then, just as is the case with Implementation example 1, Test samples 1 to 3 of the second embodiment of the high-frequency wiring board 11 are each subjected to measurement of reflection loss of high-frequency signals. The measurement results are the same as in Test samples 1 to 3 of Implementation example 1 shown in FIG. 5.

Hence, according to the second embodiment of the high-frequency wiring board 11 of the invention, given that the interval between the first line conductor 13 and part of the first coplanar ground conductor 16 located around each side of the line conductor, as well as the interval between the second line conductor 14 and part of the second coplanar ground conductor 17 located around each side of the line conductor, is S, and that the distance between the first line conductor 13 and the first inter-layer ground conductor 19a facing each other via the dielectric layer 12a, as well as the distance between the second line conductor 14 and the second inter-layer ground conductor 19b facing each other via the dielectric layer 12b, is H, then the following relationship holds: S<H/2. As a result, it has been confirmed that occurrence of characteristic impedance mismatch can be suppressed in the joint between the first/second line conductor 13, 14 and the through conductor 15, and thus satisfactory transmission characteristics can be achieved in transmission of a millimeter-wave-band high-frequency signal.

It is to be understood that the application of the invention is not limited to the specific embodiments described heretofore, and that many modifications and variations of the invention are possible within the spirit and scope of the invention. In the above-described embodiments, for example, in the second embodiment of the high-frequency wiring board 11 of the invention, the first and second line conductors 13 and 14 are formed on the top and bottom surfaces of the dielectric substrate 12, respectively. In the alternative, in a case where the dielectric substrate 12 is composed of a larger number of dielectric layers stacked on top of one another, the line conductors can be interposed between the dielectric layers. That is, the line conductors are formed within the dielectric substrate 12.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency wiring board comprising:
   a dielectric substrate;
   a first line conductor formed on one principal surface of the dielectric substrate;
   a second line conductor formed on another principal surface of the dielectric substrate, with its one end arranged face to face with one end of the first line conductor;
   a through conductor piercing through the dielectric substrate, for providing electrical connection between the one ends of the first and second line conductors;
   a first coplanar ground conductor formed around the one end of the first line conductor of the one principal surface at a predetermined interval; and
   a second coplanar ground conductor formed around the one end of the second line conductor of the other principal surface at a predetermined interval,
   wherein the following relationship holds:

$S<H/2$ in which S represents an interval between the first line conductor and part of the first coplanar ground conductor located around each side of the first line conductor, as well as an interval between the second line conductor and part of the second coplanar ground conductor located around each side of the second line conductor, and H represents a distance between the first line conductor and the second coplanar ground conductor facing each other via the dielectric substrate, as well as a distance between the second line conductor and the first coplanar ground conductor facing each other via the dielectric substrate.

2. The high-frequency wiring board of claim 1, wherein the interval between the one end of the first line conductor and the first coplanar ground conductor, as well as the interval between the one end of the second line conductor and the second coplanar ground conductor, is made longer than the interval S, and equal to or shorter than three times the interval S.

3. The high-frequency wiring board of claim 2, wherein a high-frequency signal to be transmitted through the first and second line conductors falls in a range from 55 to 80 GHz.

4. The high-frequency wiring board of claim 1, wherein the interval between the one end of the first line conductor and the first coplanar ground conductor, as well as the interval between the one end of the second line conductor and the second coplanar ground conductor, is made shorter than the interval S.

5. The high-frequency wiring board of claim 4, wherein a high-frequency signal to be transmitted through the first and second line conductors falls in a range from 80 to 110 GHz.

6. A high-frequency wiring board comprising:
   a dielectric substrate composed of a plurality of dielectric layers stacked on top of each other;
   a first line conductor formed on one principal surface of the dielectric layer;
   a second line conductor formed on another principal surface, which is located differently from the one principal surface, of the dielectric layer, with its one end arranged face to face with one end of the first line conductor;
   a through conductor piercing through the dielectric layers, for providing electrical connection between the one ends of the first and second line conductors;
   a first coplanar ground conductor formed around the one end of the first line conductor of the one principal surface at a predetermined interval;
   a second coplanar ground conductor formed around the one end of the second line conductor of the other principal surface at a predetermined interval;
   a first inter-layer ground conductor which is formed between the dielectric layers interposed between the first line conductor and the other principal surface; and
   a second inter-layer ground conductor which is formed between the dielectric layers interposed between the second line conductor and the one principal surface,
   wherein the following relationship holds:

$S<H/2$ in which S represents an interval between the first line conductor and part of the first coplanar ground conductor located around each side of the first line conductor, as well as an interval between the second line conductor and part of the second coplanar ground conductor located around each side of the second line conductor and H represents a distance between the first line conductor and the first inter-layer ground conductor facing each other via the dielectric layer, as well as a distance between the second line conductor and the second inter-layer ground conductor facing each other via the dielectric layer.

7. The high-frequency wiring board of claim 6, wherein the interval between the one end of the first line conductor and the first coplanar ground conductor, as well as the interval between the one end of the second line conductor and the second coplanar ground conductor, is made longer than the interval S, and equal to or shorter than three times the interval S.

8. The high-frequency wiring board of claim 7, wherein a high-frequency signal to be transmitted through the first and second line conductors falls in a range from 55 to 80 GHz.

9. The high-frequency wiring board of claim 6, wherein the interval between the one end of the first line conductor and the first coplanar ground conductor, as well as the interval between the one end of the second line conductor and the second coplanar ground conductor, is made shorter than the interval S.

10. The high-frequency wiring board of claim 9, wherein a high-frequency signal to be transmitted through the first and second line conductors falls in a range from 80 to 110 GHz.

* * * * *